United States Patent
Weeks et al.

(10) Patent No.: US 7,169,234 B2
(45) Date of Patent: Jan. 30, 2007

(54) APPARATUS AND METHODS FOR PREVENTING ROTATIONAL SLIPPAGE BETWEEN A VERTICAL SHAFT AND A SUPPORT STRUCTURE FOR A SEMICONDUCTOR WAFER HOLDER

(75) Inventors: Thomas M. Weeks, Gilbert, AZ (US); Lewis C. Barnett, Tempe, AZ (US); Loren R. Jacobs, Chandler, AZ (US); Eric R. Wood, Queen Creek, AZ (US); Michael W. Halpin, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 281 days.

(21) Appl. No.: 10/769,549

(22) Filed: Jan. 30, 2004

(65) Prior Publication Data
US 2005/0166849 A1 Aug. 4, 2005

(51) Int. Cl.
C23C 16/00 (2006.01)
C23F 1/00 (2006.01)
H01L 21/306 (2006.01)

(52) U.S. Cl. .............. 118/730; 118/728; 118/729; 156/345.51; 156/345.52; 156/345.53; 156/345.54; 156/345.55

(58) Field of Classification Search ............ 118/730; 156/345.55
See application file for complete search history.

(56) References Cited

U.S. PATENT DOCUMENTS

| | | | |
|---|---|---|---|
| 5,044,943 A | 9/1991 | Bowman et al. | |
| 5,117,769 A | 6/1992 | deBoer et al. | |
| 5,374,315 A | 12/1994 | deBoer et al. | |
| 5,472,510 A * | 12/1995 | Green et al. | 118/730 |
| 5,527,393 A | 6/1996 | Sato et al. | |
| 5,562,947 A * | 10/1996 | White et al. | 427/255.5 |
| 6,113,702 A | 9/2000 | Halpin et al. | |
| 6,486,550 B1 * | 11/2002 | Travis | 257/726 |
| 2003/0034741 A1 * | 2/2003 | Jang et al. | 315/111.81 |
| 2003/0173031 A1 * | 9/2003 | Aggarwal et al. | 156/345.51 |
| 2003/0205324 A1 * | 11/2003 | Keeton et al. | 156/345.5 |
| 2003/0224105 A1 * | 12/2003 | Chondroudis et al. | 427/240 |

FOREIGN PATENT DOCUMENTS

| | | |
|---|---|---|
| EP | 0 445 596 A2 | 2/1991 |
| JP | 02309008 A * | 12/1990 |

* cited by examiner

Primary Examiner—Parviz Hassanzadeh
Assistant Examiner—Rakesh Dhingra
(74) Attorney, Agent, or Firm—Knobbe Martens Olson & Bear LLP

(57) ABSTRACT

A substrate support assembly positively secures a substrate holder support to a rotation shaft with respect to rotationally applied forces. A substrate holder support is configured to have an opening in a socket into which, when aligned with an indentation in the rotational shaft to form a passage, a retaining member is removably inserted to engage both the socket opening and the shaft indentation. Methods of rotating a substrate while minimizing rotational slippage of the substrate holder support with respect to the shaft are also provided.

23 Claims, 16 Drawing Sheets

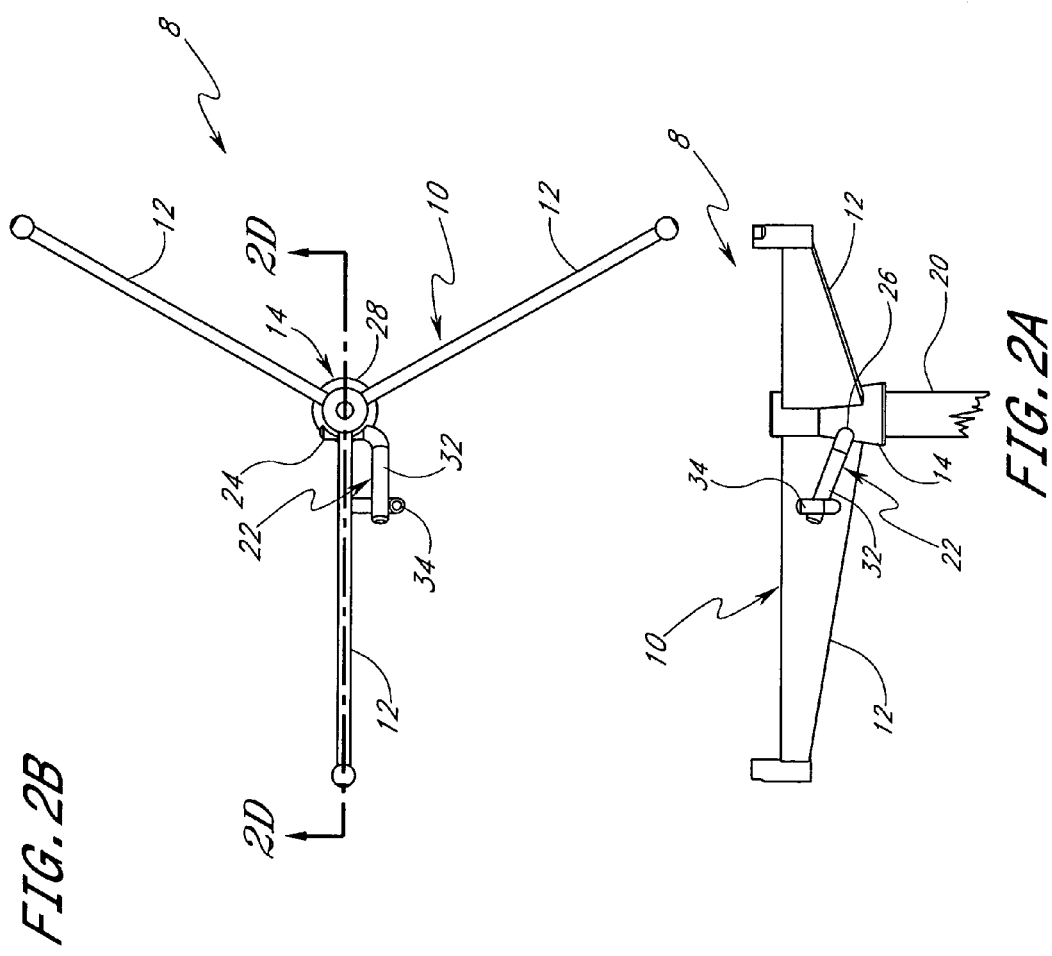

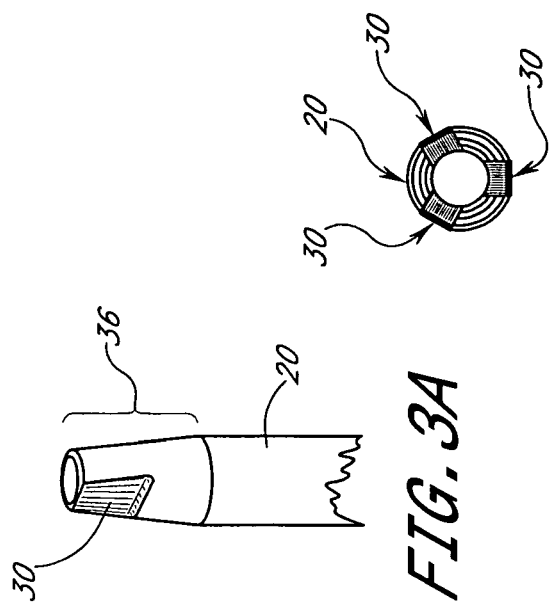
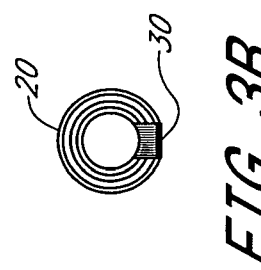
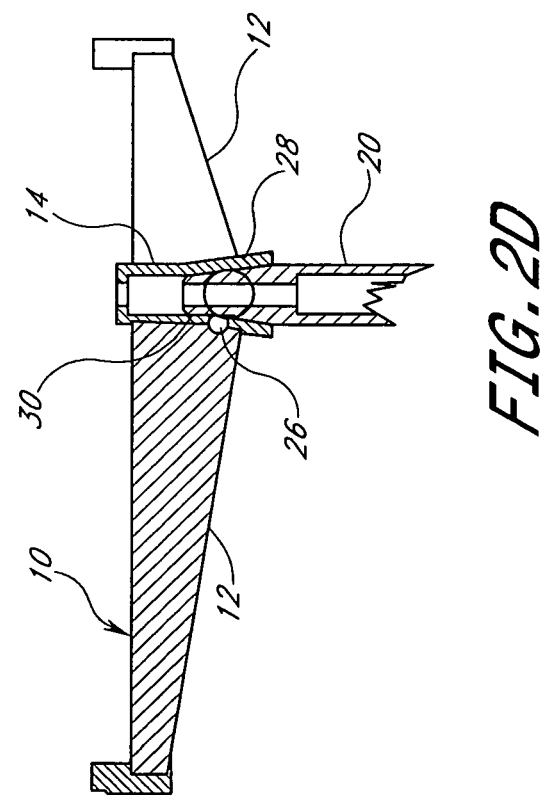

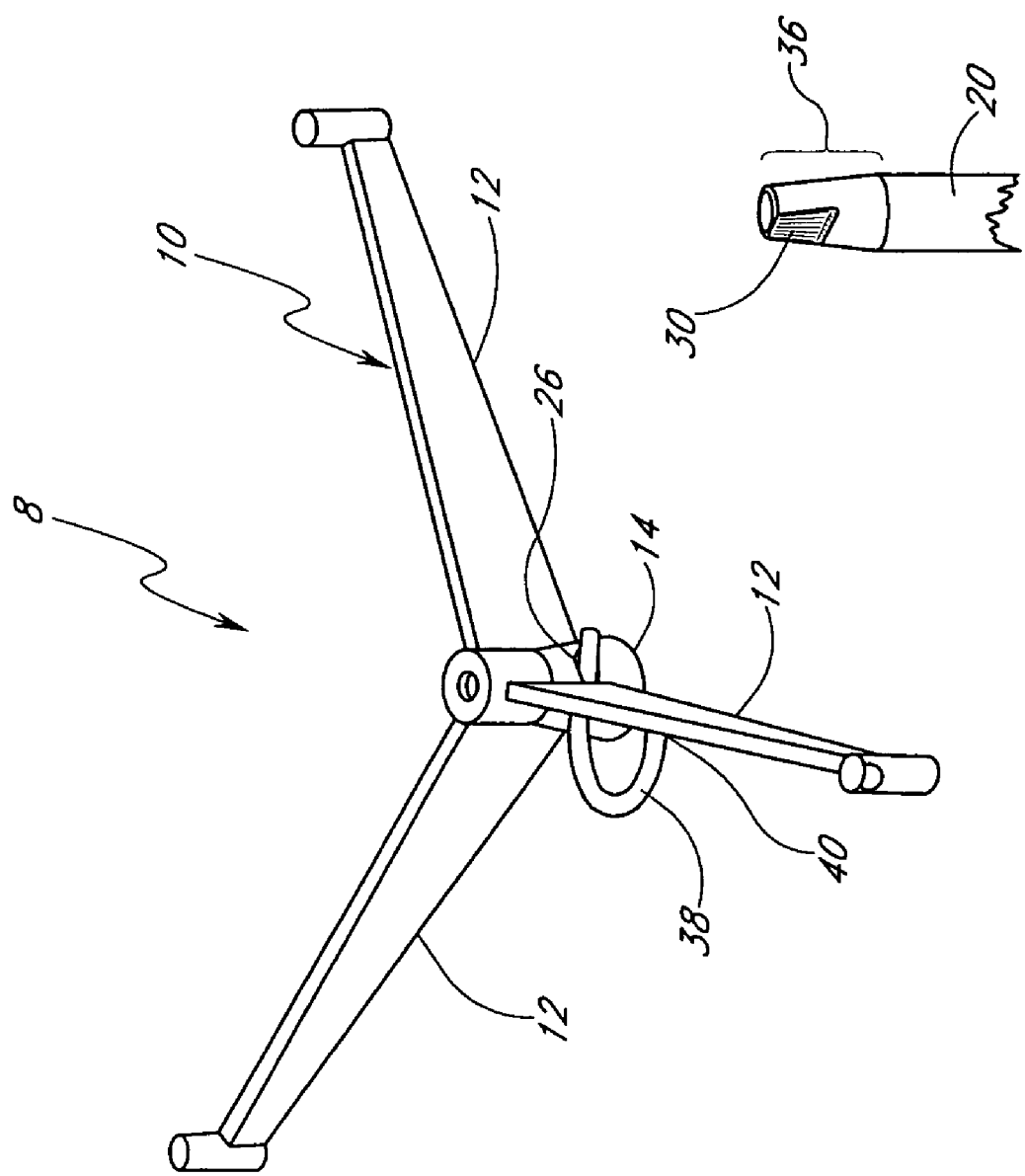

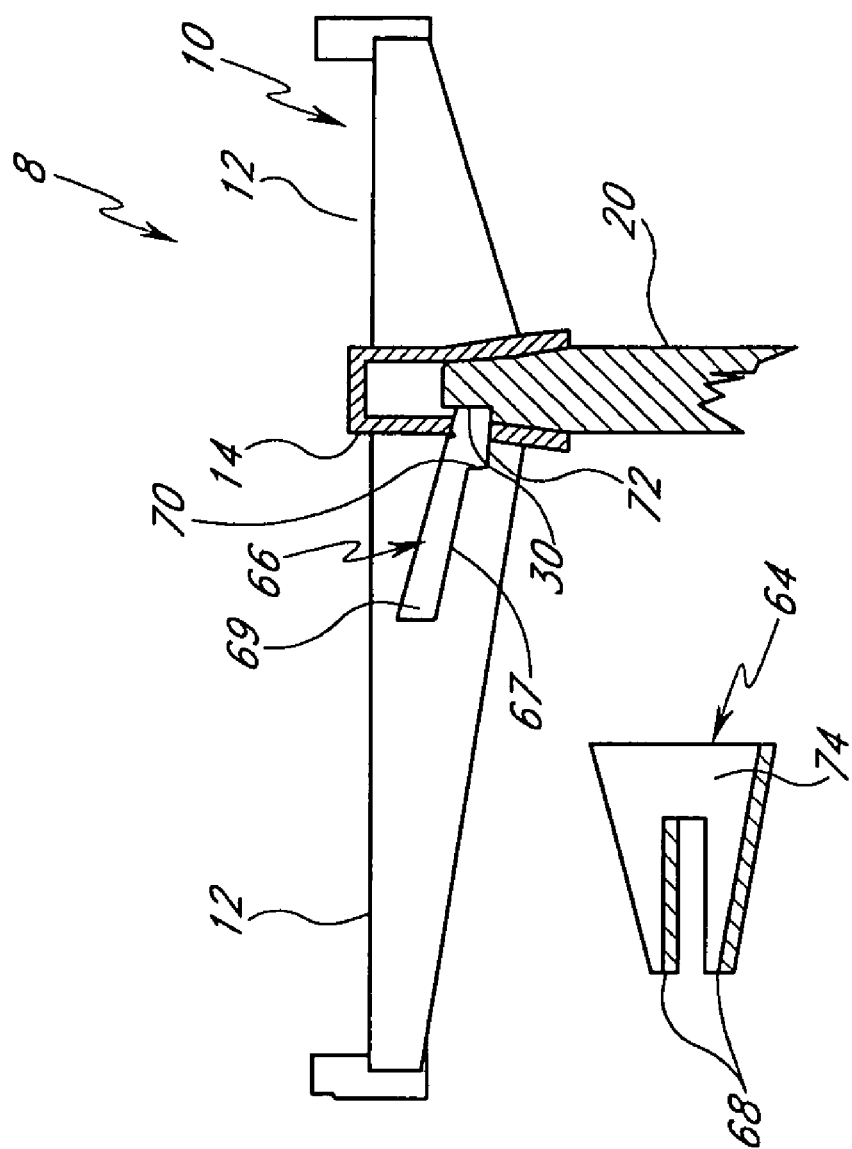

APPARATUS AND METHODS FOR PREVENTING ROTATIONAL SLIPPAGE BETWEEN A VERTICAL SHAFT AND A SUPPORT STRUCTURE FOR A SEMICONDUCTOR WAFER HOLDER

BACKGROUND OF THE INVENTION

1. Field of the Invention

The present invention generally relates to the field of substrate processing and, more particularly, to apparatuses and methods for preventing relative rotation of a vertical support shaft and a support structure for a wafer holder.

2. Description of the Related Art

In the processing of substrates, such as semiconductor wafers, a substrate or wafer holder is generally employed inside a reaction chamber to both evenly support a wafer and to ensure even heat distribution across the surface of the wafer. If the wafer holder helps to attract radiant energy, it is called a susceptor. The susceptor or wafer holder is supported by an underlying support (e.g., a quartz "spider") having a socket which is configured to mate with a portion of an elongated rotation shaft. In one common configuration, the shaft is rotationally linked to a motor, which effectuates the rotation of the support. In turn, the wafer holder supported by the rotating wafer holder support is also rotated, as is the wafer resting upon the wafer holder. During wafer processing (e.g., chemical vapor deposition, physical vapor deposition, etching, etc.) it is desirable for the wafer to be evenly rotated. Even small deviations in the speed of rotation or "wobble" can result in uneven processing of the wafer surface, which is generally undesirable.

In the past, wafer holders have been designed for 200 mm wafers. Currently, larger, heavier wafer holders configured to accommodate 300 mm wafers are used more frequently due to their higher semiconductor device yield (e.g., microchip) made possible by the larger surface area of 300 mm wafers.

SUMMARY OF THE INVENTION

Although rotational slippage between the wafer holder support (also referred to herein as a spider) and rotation shaft is a problem that has been known to occasionally occur on 200 mm systems, the rotational inertia of the 300 mm susceptor is 6.1 times greater than that of the 200 mm systems. Therefore, the probability of the spider slipping with respect to the rotation shaft is much greater. Slippage between a spider socket and the rotation shaft causes polishing of the precisely machined mating surfaces of the shaft and the socket interior, thereby deforming the mating surfaces so that the shaft and the spider socket no longer precisely fit together. This polishing of the machined surfaces of the shaft and socket interior can lead to further slippage of the surfaces with respect to one another. In addition, this polishing can also introduce wafer holder wobble. Rotational slippage of the spider socket with respect to the shaft can also generate particulate contamination by depositing dust around the tubulation on the bottom of the reaction chamber.

The present invention addresses the aforementioned problems, among others, by providing apparatuses and methods of rotationally locking the wafer holder support (or "spider") to the shaft. Advantageously, implementation of a wafer holder support rotationally locked to the shaft aids in the prevention of undesirable rotational slippage, thereby ensuring appropriate substrate or wafer orientation. In addition, preferred embodiments of the present invention can be freely lifted in a vertical direction, even when the wafer holder support is rotationally locked to the shaft. Preferred embodiment also decrease wafer holder support wobble, thereby helping to ensure uniform deposition. Preferred embodiments also reduce the likelihood of undesirable generation of particulate contaminants generated by friction between shifting components. Preferred embodiments allow for easy assembly and disassembly of the provided parts, in addition to maintaining the productive life of individual parts.

In accordance with one aspect of the present invention, a support assembly for supporting a substrate holder during substrate processing is provided. The assembly includes a substrate holder support which prevents rotational slippage of the substrate holder support relative to a rotational drive.

In a preferred embodiment, a retaining member is inserted into an opening in the substrate holder support socket so that the retaining member contacts an indentation or contact surface of the rotational drive or shaft when the shaft is inserted in the substrate holder support socket and rotational slippage of the substrate holder support relative to the shaft is thereby prevented. In one preferred embodiment, the retaining member is a L-shaped member, while in another preferred embodiment the retaining member is a flexible member which is U-shaped when engaged with the opening in the substrate holder support socket. In yet other preferred embodiments, the retaining member is a corner shaped retaining member, while in another preferred embodiment the retaining member is a key which is configured to straddle an arm of the substrate holder support while being inserted in the opening in the substrate holder socket.

In accordance with another aspect of the present invention, a substrate processing system is provided. The system includes a support member having a receptor and a plurality of arms extending generally radially outward from the receptor. The arms support an underside of a holder and the receptor has a hole in a sidewall of the receptor. The system also includes a locking key and a rotational linkage. The rotational linkage has an end portion configured to be received within the receptor such that the rotational linkage is at least partially rotatable with respect to the receptor about a longitudinal axis of the rotational linkage. The end portion of the rotational linkage also has at least one retaining surface. The at least one retaining surface and the hole are configured so that when the rotational linkage is rotated to a locking position, the at least one retaining surface and the hole together form a passage sized and configured to receive the locking key. The locking key thereby prevents the support member from rotating independently of the rotational linkage.

In accordance with another aspect of the present invention, a method of assembling a rotating susceptor assembly for a semiconductor processing system is provided. A substrate holding structure is coupled to a rotational linkage so as to prevent rotational slippage of the susceptor holding structure relative to the rotational linkage during rotation of the substrate holding structure.

In accordance with another aspect of the present invention, a method of rotating a substrate is provided. A susceptor assembly is rotated by coupling a substrate holding assembly to a rotational linkage so as to prevent rotational slippage of the susceptor holder support relative to the a rotational source when the substrate holding assembly is rotated. In a preferred embodiment, the substrate holding assembly is placed on the rotational linkage and rotated until the assembly drops into an engaged position.

In another preferred embodiment, the substrate holder support includes a rotational drive interface. A rotational drive and the rotational drive interface are shaped to precisely fit together to prevent rotational slippage of the substrate holder support relative to the rotational drive.

In another preferred embodiment, a substrate rotating system is provided. The system includes a shaped rotational shaft and a susceptor support correspondingly shaped to be joined with the rotational shaft so as to prevent rotational slippage between the shaft and the susceptor support.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 2A is a schematic side view of a support assembly according to one embodiment of the invention, employing an elbow-shaped retaining member, a shaft having an indentation for receiving the retaining member, and a securing member for securing the retaining member in place;

FIG. 2B is a schematic top view of the support assembly shown in FIG. 2A;

FIG. 2C is a magnified view of the retaining member employed in the support assembly of FIGS. 2A and 2B;

FIG. 2D is a side cross-sectional view of the support assembly of FIGS. 2A and 2B, taken along line 2D—2D of FIG. 2B, selected to show more clearly the position and orientation of the retaining member with respect to the shaft indentation;

FIG. 3A is a magnified perspective view of an elongated support shaft in accordance with one embodiment of the present invention, the shaft having a tapered end portion and a single indentation therein;

FIG. 3B is a top view of the shaft of FIG. 3A;

FIG. 3C is a top view of another embodiment of an elongated support shaft of the present invention, having a tapered tip and multiple shaft indentations;

FIG. 4A is a schematic top perspective view of a support assembly according to another embodiment of the present invention, employing a flexible retaining member;

FIG. 6B is a side cross-section of the support assembly of FIG. 6A taken along line 6B—6B.

DETAILED DESCRIPTION OF THE PREFERRED EMBODIMENTS

Figure 1A:
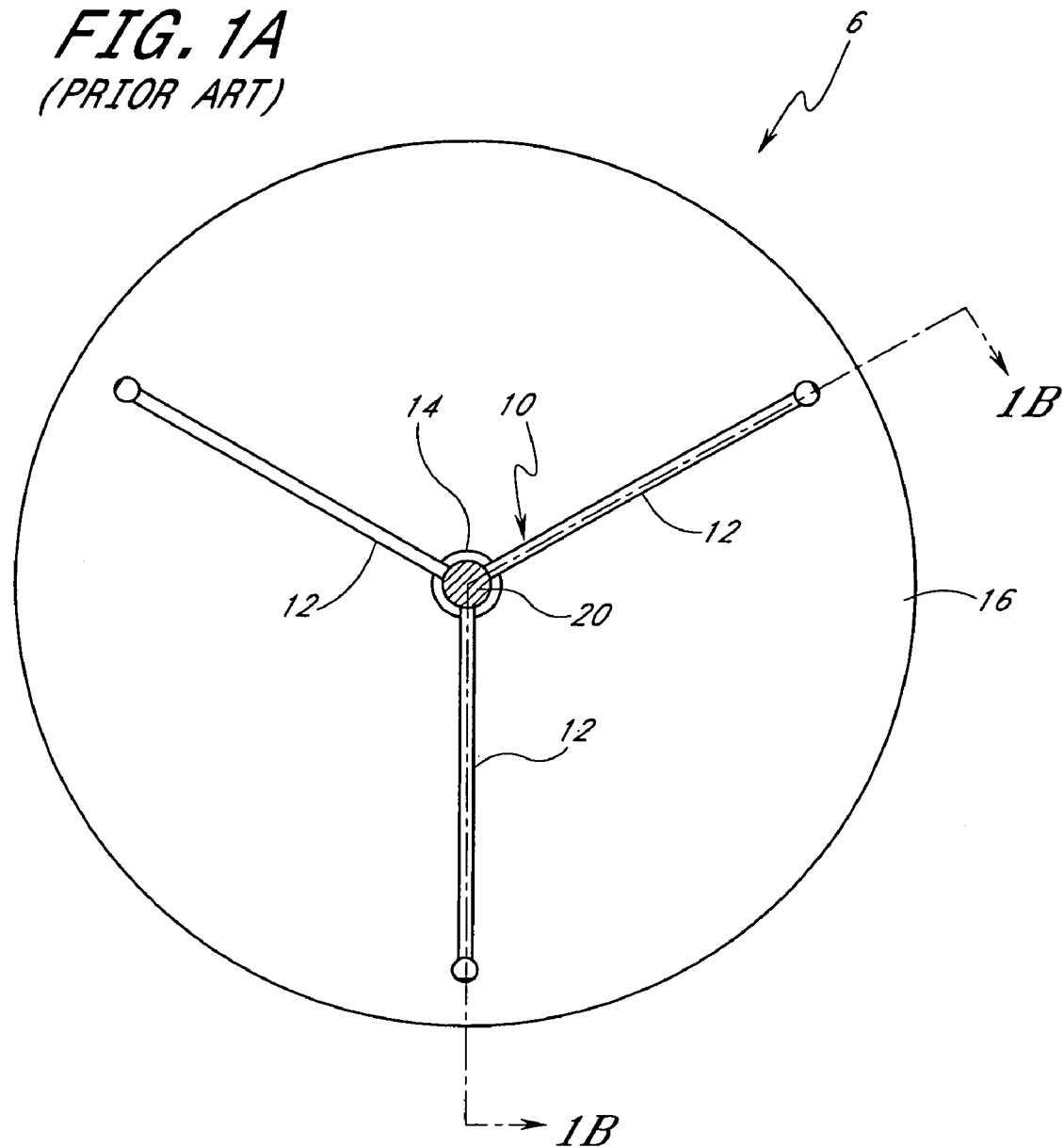
FIG. 1A is a bottom cross-sectional view of a prior art support assembly, comprising a shaft, substrate holder support and substrate holder, taken along line 1A—1A of FIG. 1B.
Figure 1B:
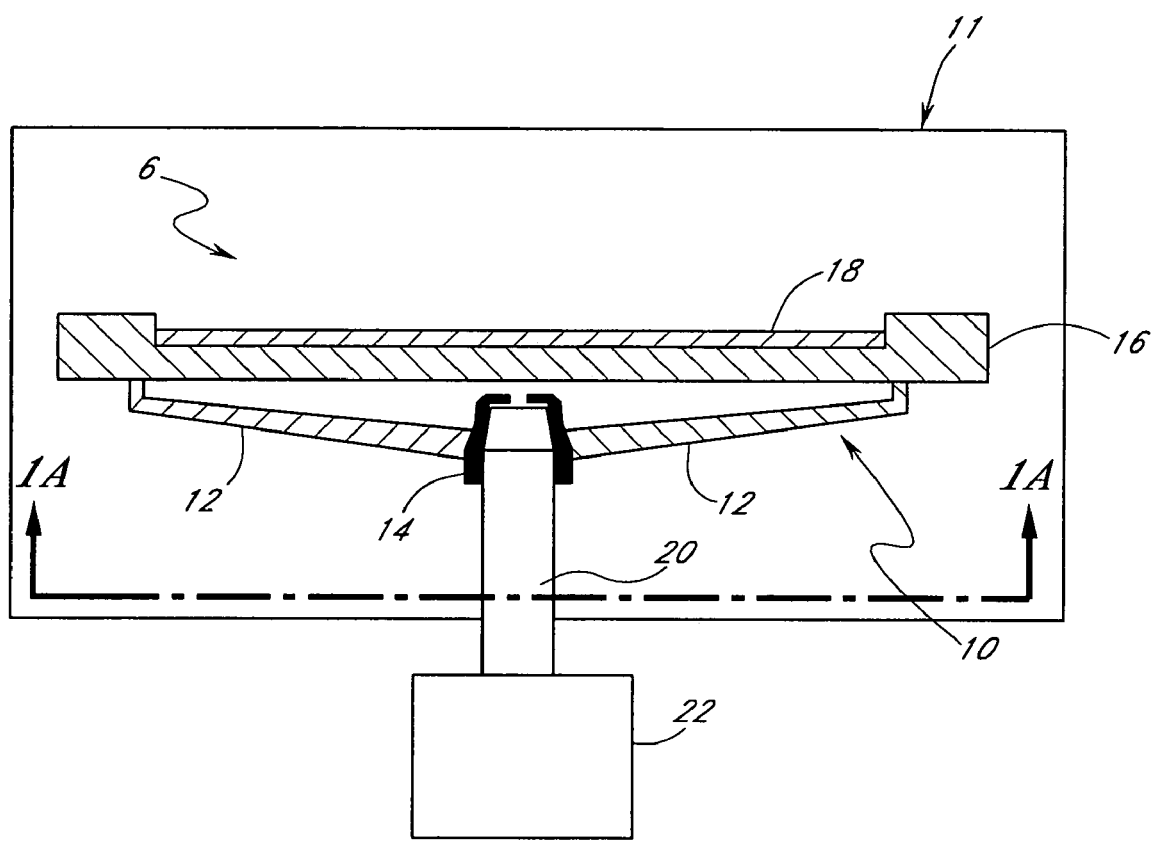
FIG. 1B is a side cross-sectional view of the prior art support assembly shown in FIG. 1A, taken along line 1B—1B of FIG. 1A.

FIGS. 1A and 1B are schematic depictions of a support assembly 6 of the prior art. A substrate (or wafer) holder support, or spider 10, is shown in a reaction chamber 11. The spider 10 has a plurality of support arms 12 extending radially outward and upward from a central socket 14 to support the underside of a substrate holder 16, such as a susceptor. The substrate holder 16 rests upon the support arms 12 and is configured to hold a substrate or wafer 18. Underneath the spider 10, an elongated shaft 20 is mated with the spider socket 14, providing a coupling that allows the spider 10 to be rotated when the elongated shaft 20 is rotated by a motor 22. As explained above in the Background section, this coupling does not satisfactorily prevent relative rotation between the shaft 20 and the socket 14, particularly when the mass of the system has increased by movement from 200 mm wafers to 300 mm wafers. Also, as the mating surfaces rub against one another and deform, wobbling of the substrate holder support is introduced, which adversely affects wafer processing.

FIGS. 2A–2D show a support assembly 8 according to one embodiment of the present invention. The assembly 8 includes an elbow-shaped retaining member 22 or locking key having an engaging portion 24 and a securing portion 32. The engaging portion 24 is configured to be inserted into an opening 26 in a side wall 28 of the socket 14 when both the socket opening 26 and an indentation 30 in the shaft 20 are aligned to provide a preferably continuous passage for the retaining member 22. The retaining member 22 preferably substantially fills the opening 26. Preferably, the indentation 30 is a flattened, planar portion on an otherwise curved surface on the shaft 20 (see FIGS. 3A–3C). When so inserted, the retaining member 22 is in an engaged position. The opening 26 may extend partially through one of the support arms 12 of the spider 10, as shown. When in an engaged position, the engaging portion 24 of the retaining member 22 preferably protrudes from the socket side wall 28 on the opposite side of the support arm 12 from which the retaining member 22 was inserted. The inserted retaining member 22 serves to secure the spider 10 (and therefore the wafer holder 16 (FIG. 1A) supported by the spider 10) to the elongated shaft 20 inserted therein by engaging both the socket opening 26 and the indentation 30 (FIG. 3) in the elongated shaft 20. Engagement of both the socket opening 26 and the shaft indentation 30 by the retaining member 22 preferably prevents the shaft 20 from rotating with respect to the spider socket 14, i.e. rotational slippage.

Preferably, embodiments of the present invention employ locking features configured to prevent rotational slippage when a retaining member 22 is in an engaged position, without preventing the spider 10 from being lifted vertically in order to remove the spider 10 from the shaft 20 or rotational drive or rotational linkage. In other words, the retaining member (e.g., locking key) locks the support member to the rotational drive with respect to rotationally and horizontally applied forces without locking the support member to the rotational drive with respect to vertically applied forces (e.g., forces parallel with the longitudinal axis of the rotational drive). Thus, the rotational lock need not be removed prior to lifting the spider 10 from the shaft 20, such as during routine maintenance. Despite lack of a vertical lock, the combined weight of the wafer holder 16 and the spider 10 is sufficient to prevent the substrate holder 16 from shifting vertically or lifting during processing of a substrate 18, thus keeping the retaining member 22 engaged and inhibiting rotational slippage Preferably, the securing portion 32 of the retaining member 22, which protrudes outside the spider socket 14, is held by a securing element 34 of the spider 10. In the illustrated embodiment, the securing element 34 comprises a hook member that secures the retaining member 22 in place by restraining outward movement of the securing portion 32 of the retaining member 22 when the portion 32 is rotated into the position shown. Advantageously, the portion 32 is biased by gravity into the position shown and can be rotated downwardly into that position after the retaining portion 24 engages the indentation in the locked position. The securing element 34 is configured to allow the retaining member 22 to be removed by first rotating the securing portion 32 of the retaining member 22 in a clockwise direction, thereby freeing the securing portion 32 of the retaining member 22 from the securing element 34. The engaging portion 24 can then be removed, if necessary, from the socket opening 26 by pulling the retaining member 22 out of the socket opening 26. However, as previously outlined, it is not necessary to remove the retaining member 22 in order to remove the shaft 20 from wafer holder 16, thus facilitating maintenance despite the fact that the rotational locking elements are hidden below the susceptor 16 (FIG. 1)

FIG. 2C shows a magnified view of the elbow-shaped retaining member 22 employed in the support assembly shown in FIGS. 2A and 2B, the engaging portion 24 and the securing portion 32 being more clearly shown. The illustrated retaining member 22 is generally L-shaped, but it is not necessary that the engaging portion and securing portion be perpendicular. FIG. 2D is a sectional view of FIG. 2B, with the retaining member 22 removed for clarity.

FIGS. 3A and 3B show the elongated shaft 20 employed in preferred embodiments of the present invention. Preferably, the shaft indentation 30 is configured to provide a face or faces having sufficient surface area to contact the engaged retaining member 22 to prevent or minimize the risk of the spider 10 rotating independently of the shaft 20. The shaft 20 has an indentation 30 in the end portion 36 of the shaft 20. Preferably, the end portion 36 of the elongated shaft 20 is tapered as shown and has a generally curved (illustrated as conical) surface except for the planar indentation 30. The indentation 30 is configured, when aligned with the socket opening 26, to receive the engaging portion 24 (FIG. 2) of the retaining member 22 inserted through the side wall 28 of the spider socket 14. The retaining member 22 thus links the elongated shaft 20 to the spider socket 14 to minimize or prevent rotation of the spider 10 with respect to the shaft 20. Preferably, when in an engaged position, the retaining member 22, which is perpendicular to the longitudinal axis of the shaft 20, abuts a face of the shaft indentation 30. The shaft indentation 30 preferably extends vertically in a direction parallel with the longitudinal axis of the shaft 20, thereby preventing the retaining member 22 from independently rotating about the longitudinal axis of the shaft 20. The spider 10 is prevented from rotating with respect to the shaft 20. In some embodiments, the retaining member 22 also engages a lower, horizontally-extending face of the shaft indentation 30 (i.e., the floor of the indentation 30). Preferably, the assembly is configured to maximize the surface area of contact between the shaft indentation 30 and the retaining member 22.

FIG. 3C shows an alternate shaft configuration employed in certain embodiments, in which the elongated shaft 20 has three indentations 30. The illustrated shaft 20 allows an operator to engage the closest indentation 30 during assembly (see FIGS. 7 and 8 and corresponding text below). In alternate preferred embodiments, the three indentations are slightly different with respect to one another as a result of variations due to, for example, machining imperfections, thermal expansion and/or wear after use. As a result of these differences, in operation, the operator may choose between indentations which, when engaged by the retaining member, best secure the spider to the shaft with respect to rotational forces. The three-indentation shaft 20 may be employed in any of the embodiments of the invention disclosed herein.

Figure 4C:
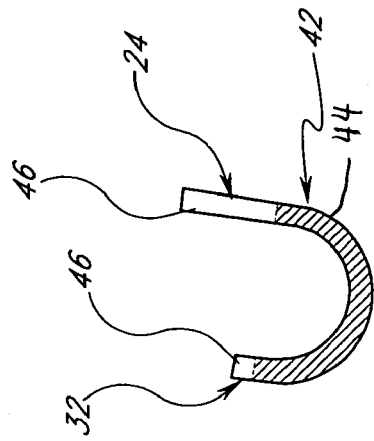
FIG. 4C is a magnified view of an alternate embodiment of the flexible retaining member shown in FIGS. 4A and 4B, shown in a flexed position.
Figure 4D:
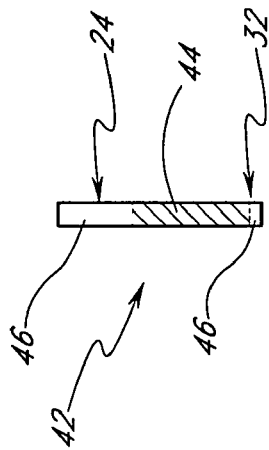
FIG. 4D is a magnified view of the spring-type retaining member of FIG. 4C in a relaxed position.
Figure 4B:
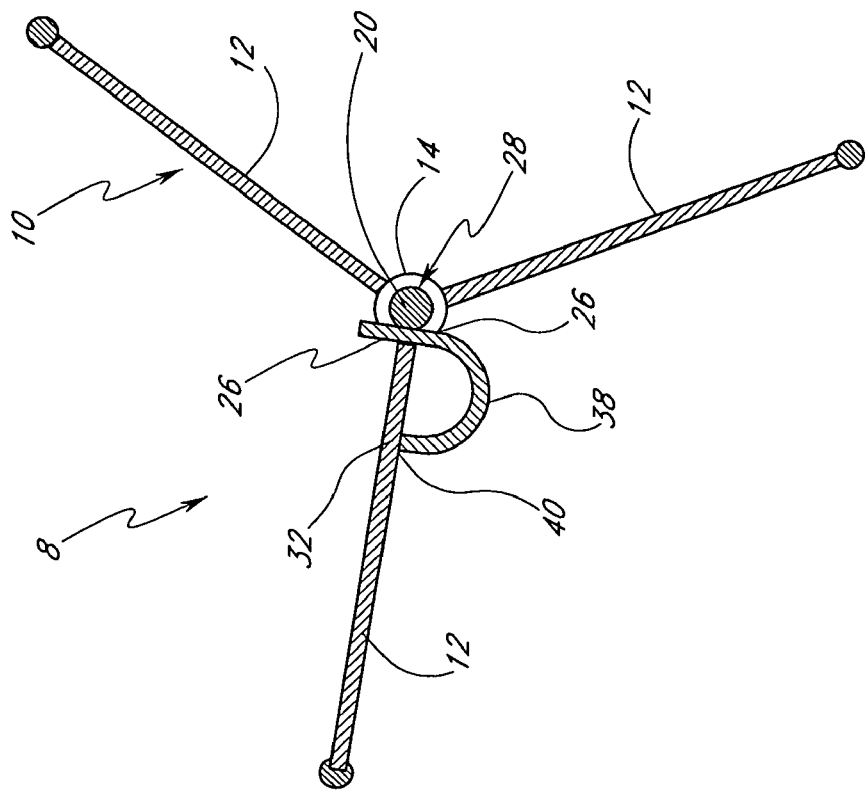
FIG. 4B is a top cross-section of the support assembly shown in FIG. 4A.

FIGS. 4A and 4B show another embodiment of the present invention, in which a flexible retaining member 38 is employed instead of the retaining member 22 illustrated in FIGS. 2A–2D. The shaft 20 is shown disengaged from socket 14 for clarity. The flexible retaining member 38 secures the shaft 20 against rotation relative to the spider socket 14. Preferably, the retaining member 38 is cylindrical. As with the embodiment employing the elbow-shaped retaining member 22 (shown in FIGS. 2A–2D) the engaging portion 24 of the retaining member 38 is designed to be inserted through the opening 26 in the side wall of the socket 14 and, when the opening 26 is aligned with the indentation 30, to engage the shaft indentation 30 and protrude beyond the opposite side of the spider arm 12 from which the engaging portion 24 is inserted. However, unlike the elbow-shaped member 22 of FIGS. 2A–2D, the flexible retaining member 38 is preferably generally straight when no forces are applied to the member 38. In addition, the retaining member 38 can be flexed so that the securing portion 32, i.e., the end not engaging the shaft indentation 30, can be inserted into an opening 40 in the spider arm 12.

When flexed and inserted into both openings 26 and 40 to rotationally secure the spider 10 to the elongated shaft 30, the flexible retaining member 38 is biased toward straightening and therefore exerts forces in directions that are perpendicular to the direction in which force is required to remove the retaining member 38. The retaining member 38 thereby holds the retaining member 38 in the desired secured position. As a result, the engaging portion 32 of the retaining member 38 preferably remains engaged with the socket opening 26 and the shaft indentation 30. Although the arm opening 40 is shown as only partially extending into arm 12, it should be understood that the arm opening 40 may extend deeper into or completely through the arm 12. In alternate arrangements, the securing portion can be secured in the arm opening by a screw or by threading the securing portion and the arm opening. The flexible retaining member 38 is preferably selectively removed by compressing the end portions 32 and 24 toward one another and pulling said portions from their respective openings. In addition, the embodiments illustrated in FIGS. 4A–4B also preferably employ the elongated shaft 20 (shown in FIG. 4A in an unmated position with respect to the socket 14) having a tapered end portion 36 and an indentation 30 as shown in FIGS. 3A–3B or, in alternate preferred embodiments, three indentations 30 as shown in FIG. 3C.

The flexible retaining member 38 is preferably constructed of a material that allows the member 38 to flex from end to end. The member 38 can be constructed of a number of flexible materials suitable for use in a process chamber environment, such as metals, plastics, and other materials or combinations of materials as will be evident to the skilled artisan in view of the present disclosure.

FIGS. 4C and 4D show an alternative embodiment of the retaining member, in a flexed and a relaxed state, respectively. Rather than being flexible from end to end, the illustrated retaining member 42 includes a central spring portion 44 interposed between two rigid elements 46. The spring portion 44 is shown by cross-hatching.

Figure 5A:
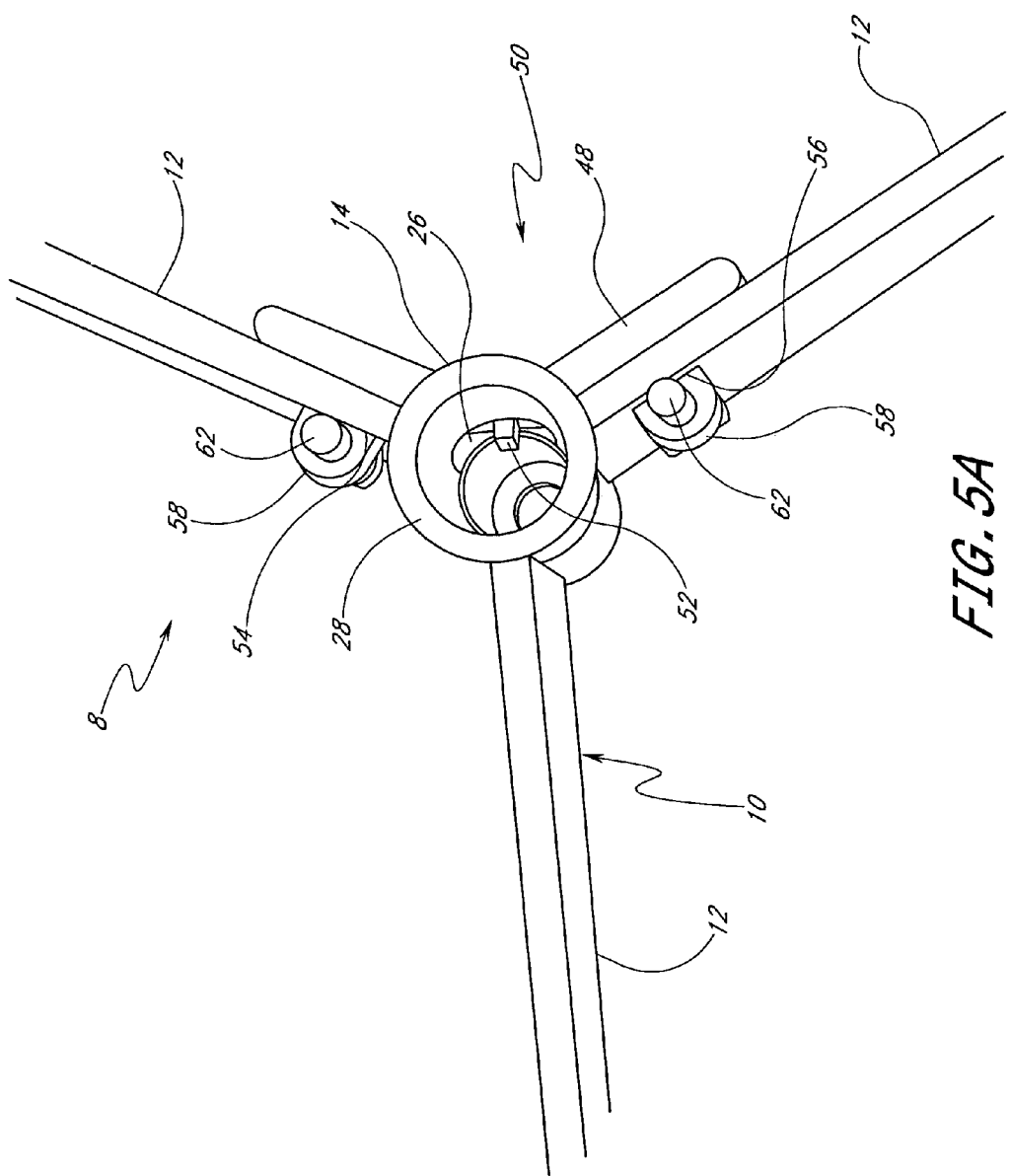
FIG. 5A is a bottom perspective view of a portion of a support assembly according to another embodiment of the invention, employing a retaining member having ears for securing it into a corner defined by two of the spider arms, the elongated shaft not being shown in order to more clearly illustrate the position of the retaining member when locked in place.
Figure 5B:
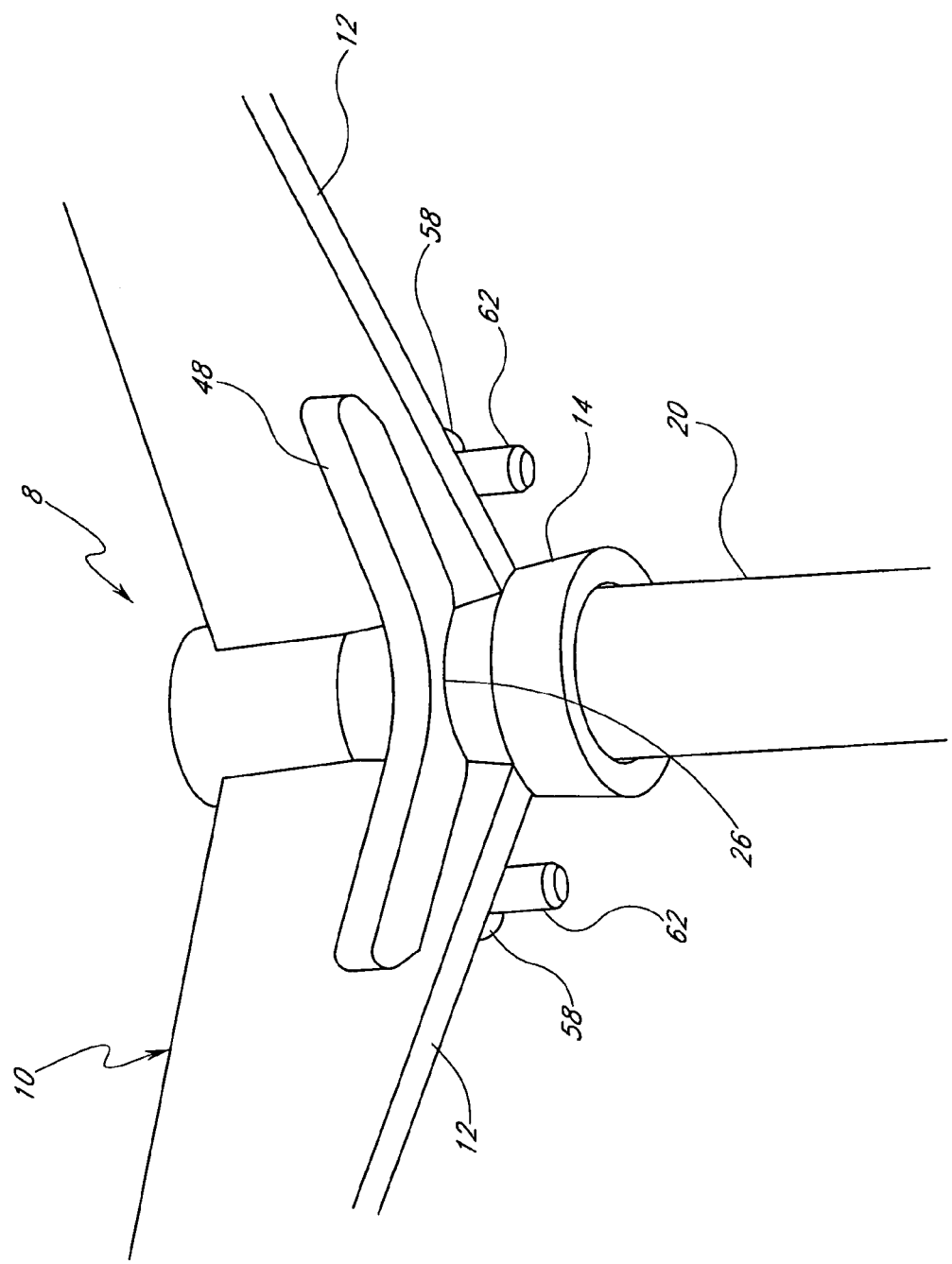
FIG. 5B is a side perspective view of the support assembly of FIG. 5A with the elongated shaft inserted into the spider socket.

FIGS. 5A and 5B illustrate a support assembly 8 employing a retaining member 48 in accordance with yet another embodiment of the invention. The retaining member 48 is preferably shaped to conform to a "corner region" 50 defined as the region between two adjacent ones of the spider arms 12, within which is located the opening 26 in the socket 14. FIG. 5A is a bottom perspective view of the spider 10. In one embodiment, the spider socket 14 and opening 26 are designed to receive an extension 52 of the retaining member 48. When the retaining member 48 is inserted into the opening 26, the extension 52 protrudes into the interior of the spider socket 14. Accordingly, when the shaft 20 is mated with the socket 14 and the indentation 30 is properly aligned with the opening 26, the extension 52 engages the indentation 30 of the shaft 20. The retaining member 48 thereby secures the spider socket 14 with respect to the shaft 20.

Figure 5C:
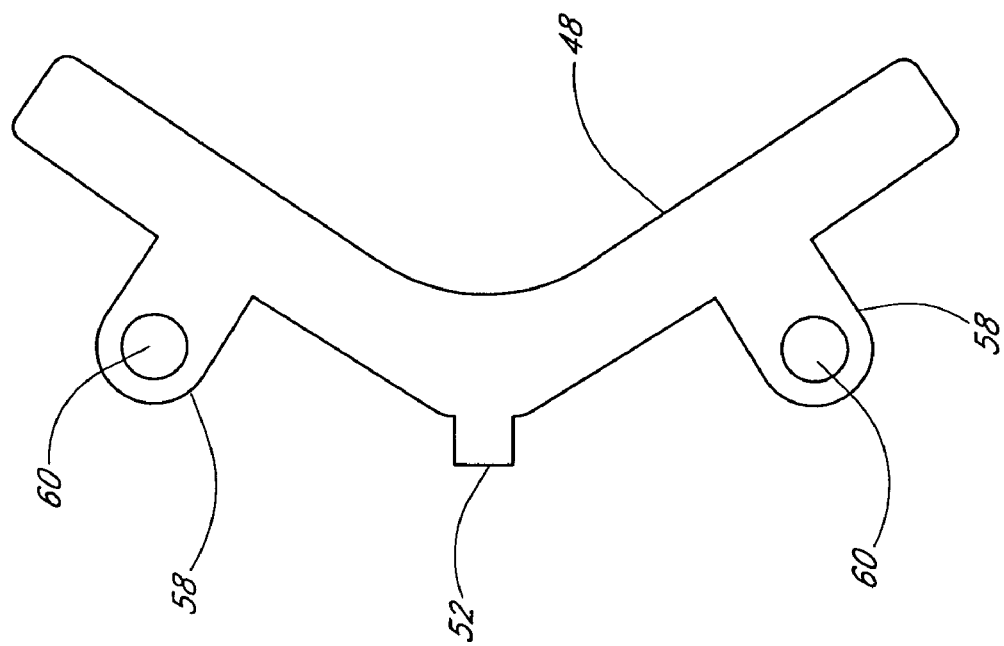
FIG. 5C is a top view of the retaining member shown in FIGS. 5A and 5B.

With further reference to FIG. 5A, a first slot 54 is located in one of the spider arms 12 that defines the corner region 50 and a second slot 56 is located in the other of such spider arms 12. The retaining member 48 preferably has extensions or ears 58 which, when inserted into the corresponding first and second slots 54, 56 of the spider arms 12, protrude from the opposite side of the spider arm 12 from which the ears were inserted. Each ear 58 preferably also has an opening 60 (FIG. 5C) that is configured to receive a locking pin 62 (FIGS. 5A, 5B and 5D) to secure the retaining member 48 in the corner region 50. Securing the retaining member 48 ensures that the extension 52 is properly aligned and remains engaged with the properly aligned shaft indentation 30, thereby preventing or minimizing rotation of the spider 10 (and therefore of the susceptor or wafer holder 16 supported by the spider 10) with respect to the elongated shaft 20. FIG. 5C is a magnified view of the retaining member 48 employed in FIGS. 5A and 5B.

Figure 5D:
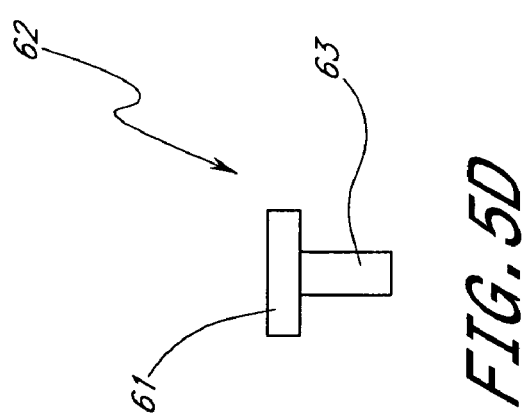
FIG. 5D is a side view of one of the locking pins of the support assembly of FIGS. 5A and 5B.

FIG. 5D is a magnified view one of the locking pins 62 employed in FIGS. 5A and 5B. In preferred embodiments, two locking pins 62 are employed to secure the retaining member 48 in the corner region 50. The locking pins 62 each have an extension 63 which is configured to be inserted in the pin holes 60 of the retaining member ears 58. In addition, the locking pins 62 have a top portion 61 which is larger than the diameter of the pin holes 60, so that when the locking pin extension 63 is placed in the pin hole 60, the locking pin 62 remains supported in place on the protruding ear 58 of the retaining member 48 (due to gravity). Specifically, the top portion 61 prevents the locking pin 62 from sliding through the pin hole 60.

When the retaining member 48 is properly aligned with the corner region 50 and the socket opening 26, both ears 58 are aligned with their respective first and second slots 54, 56. The insertion of each ear 58 into its respective slot 54, 56, and the subsequent insertion of the locking pins 62 into the pin holes 60, serves to secure the retaining member 48 in place. When aligned with the indentation of the shaft 20, the extension 52 engages the indentation 30 and, as a result, the shaft 20, when fully inserted into the socket 14, is rotationally secured to the spider socket 14 (FIG. 5B). As with the previously described embodiments, the spider 10 is not vertically locked with respect to the shaft 20, such that it can be readily lifted during maintenance.

Figure 6A:
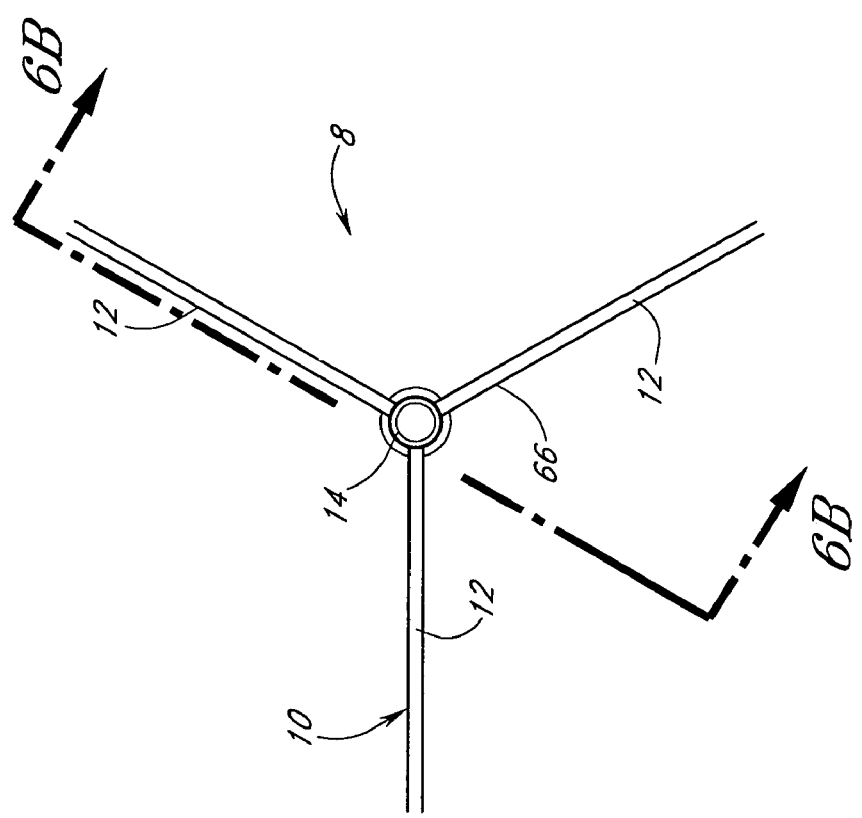
FIG. 6A is a top view of a support assembly in accordance with yet another alternate embodiment of the present invention, having a spider arm slot that accepts a retaining member having two prongs configured to straddle a wall portion defined by the slot.
Figure 6C:
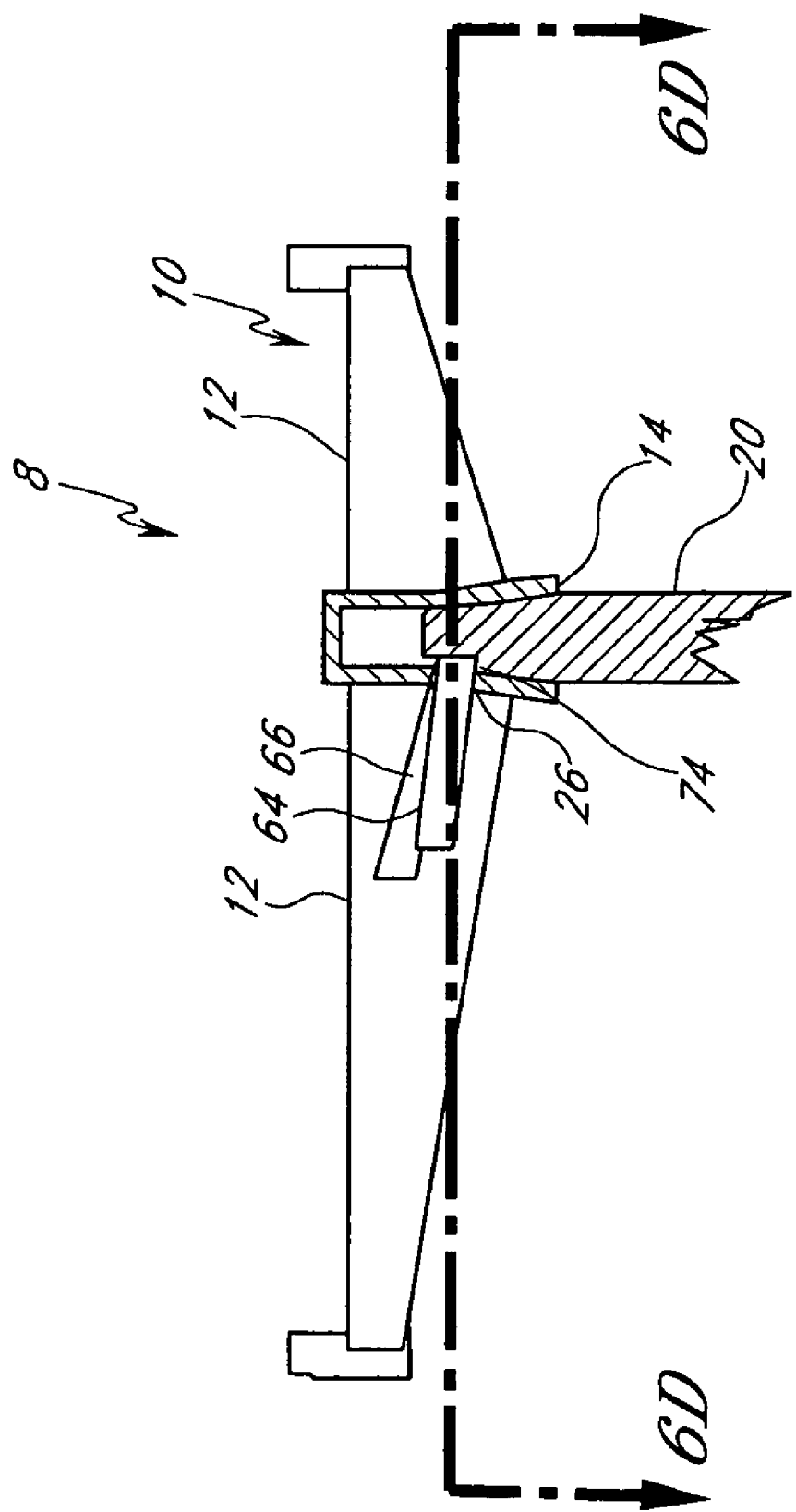
FIG. 6C shows the support assembly of FIG. 6B with the retaining member engaged within the spider arm slot.
Figure 6D:
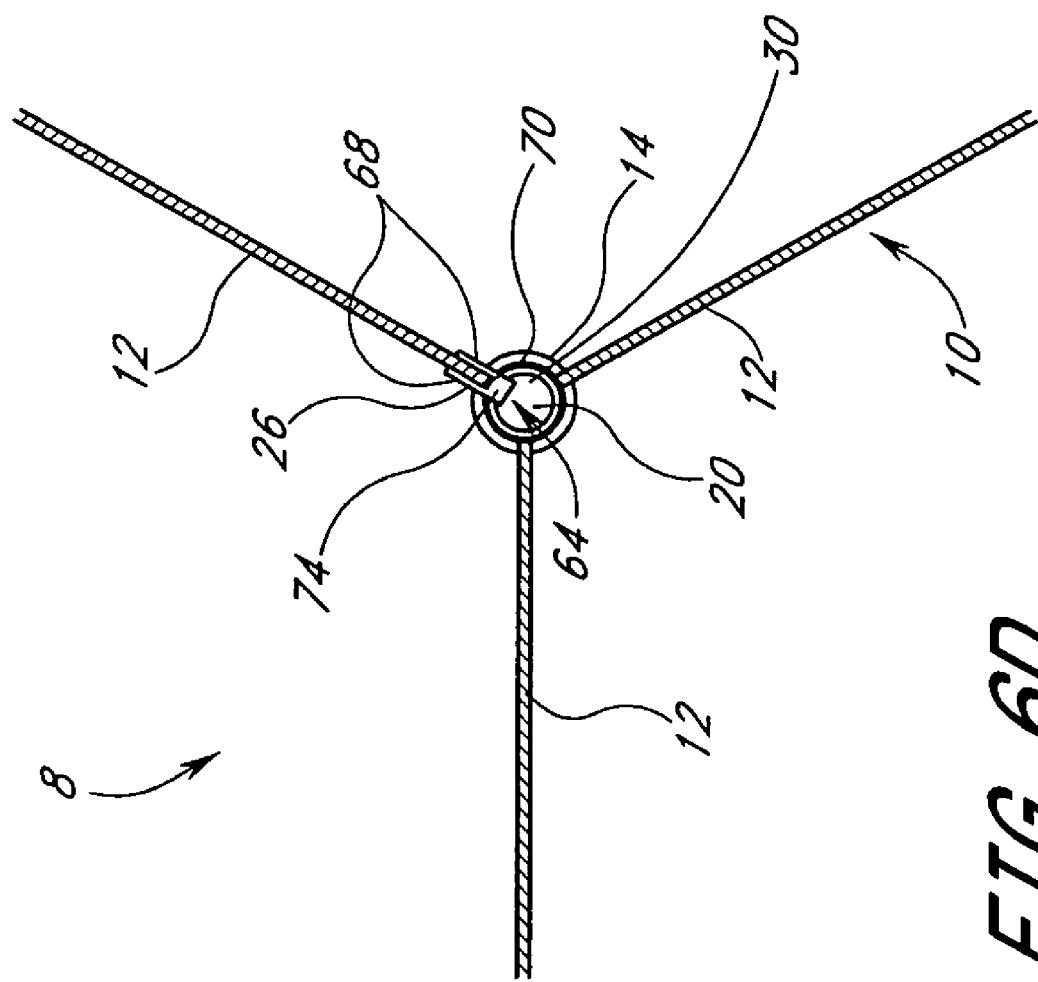
FIG. 6D is a horizontal cross-sectional view taken along line 6D—6D of FIG. 6C.

FIGS. 6A–6D illustrate a support assembly 8 in accordance with yet another embodiment of the present invention, which employs a retaining member 64 designed to be inserted into a slot 66 in the spider arm 12. When in an engaged position, the retaining member 64 engages the shaft indentation 30 aided by two prongs or arms 68 that straddle the slotted spider arm 12. The spider arm slot 66 is partially defined by a wall portion 67 (FIG. 6B) that allows the retaining member 64 to be selectively maintained within the slot 66. The wall portion 67 defines an upper portion 69 of the slot 66, as well as a lower or engaged portion 72. The slot 66 also extends into the socket 14. The lower portion or engaged portion 72 is closer to the spider socket 14 than the remainder of the slot 66. The slot 66 is configured to hold the retaining member 64 in a position in which the retaining member 64 can engage the shaft indentation 30 when the shaft 20 is fully inserted into the socket 14. When an engaging portion 74 of the retaining member 64 is in the lower portion 72 of the slot 66 as shown in FIG. 6C, the retaining member 64 is biased by gravity into a locked position in which the prongs 68 straddle the wall portion 67. In this position, the retaining member 64 therefore preferably remains in an engaged position, thereby continuing to secure the spider 10 to the shaft with respect to rotationally applied forces. The upper and lower interior surfaces of the slot 66, particularly where it enters the socket 14, serve to keep the retaining member 64 from slipping downwardly. A back wall 70 (FIG. 6B) of the wall portion 67 and the two arms 68 that straddle the slotted spider arm 12 together hold the retaining member 64 in an engaged position with respect to horizontally applied forces. FIG. 6B shows the retaining member 64 in an unengaged position separate from the support assembly 8. FIGS. 6C–6D show the retaining member 64 in an engaged position, thereby rotationally securing the spider 10 to the shaft 20. FIG. 6D, a horizontal cross-section of FIG. 6C, further illustrates how the arms 68 straddle the spider arm 12, and how the engaging portion 74 engages the shaft indentation 30. FIG. 6D also illustrates the position of the back wall 70 of the spider arm slot 66 (shown in FIG. 6B in a side view without the retaining member inserted) with respect to the retaining member 64.

In certain preferred embodiment, the substrate holder is configured to hold a 300 mm wafer, while in another embodiments the substrate holder is configured to hold a 200 mm wafer.

Preferred embodiments of the present invention are configured to couple a substrate holder support to a form of rotational linkage, such as a shaft or other form of linkage, preferably by linking the rotational linkage to the substrate holder support with a linking member, so as to prevent rotational slippage of the substrate holder support with respect to the rotational linkage. The linking member, such as a retaining member or locking key, is preferably configured to engage both the rotational linkage and the substrate holder support or spider. Preferably, the linking member, engages an opening in the substrate holder support, such as a spider, and contacts a contact surface or retaining surface, such as an indentation, on the rotational linkage, e.g. a shaft. However, the skilled artisan will readily appreciate modifications of the preferred embodiments disclosed herein which would fall within the scope of the claims. For example, the shaft could have an upturned integral receptor or socket with an opening and the spider could have an integral downward extension having the contact surface or indentation. The skilled artisan will understand in view of the present disclosure that, even in light of these structural modifications, the linking member described herein would still function to prevent the rotational slippage of the spider with respect to the shaft. In an alternate embodiment, an integral retaining member (e.g., permanently installed) is employed to prevent rotational slippage. Advantageously, the illustrated embodiments allow the ready retrofit of existing spiders simply by machining holes into their sockets and arms.

The retaining member used in embodiments employing a retaining member which is preferably rigid (e.g., the retaining member employed in FIGS. 2A–2D, 3A–3C, 5A–5D, and 6A–6D) are preferably formed from a ceramic material. More preferably the retaining member is quartz, while in alternate embodiments the retaining member is formed from silicon carbide (SiC) or graphite coated with silicon carbide.

Figure 7:
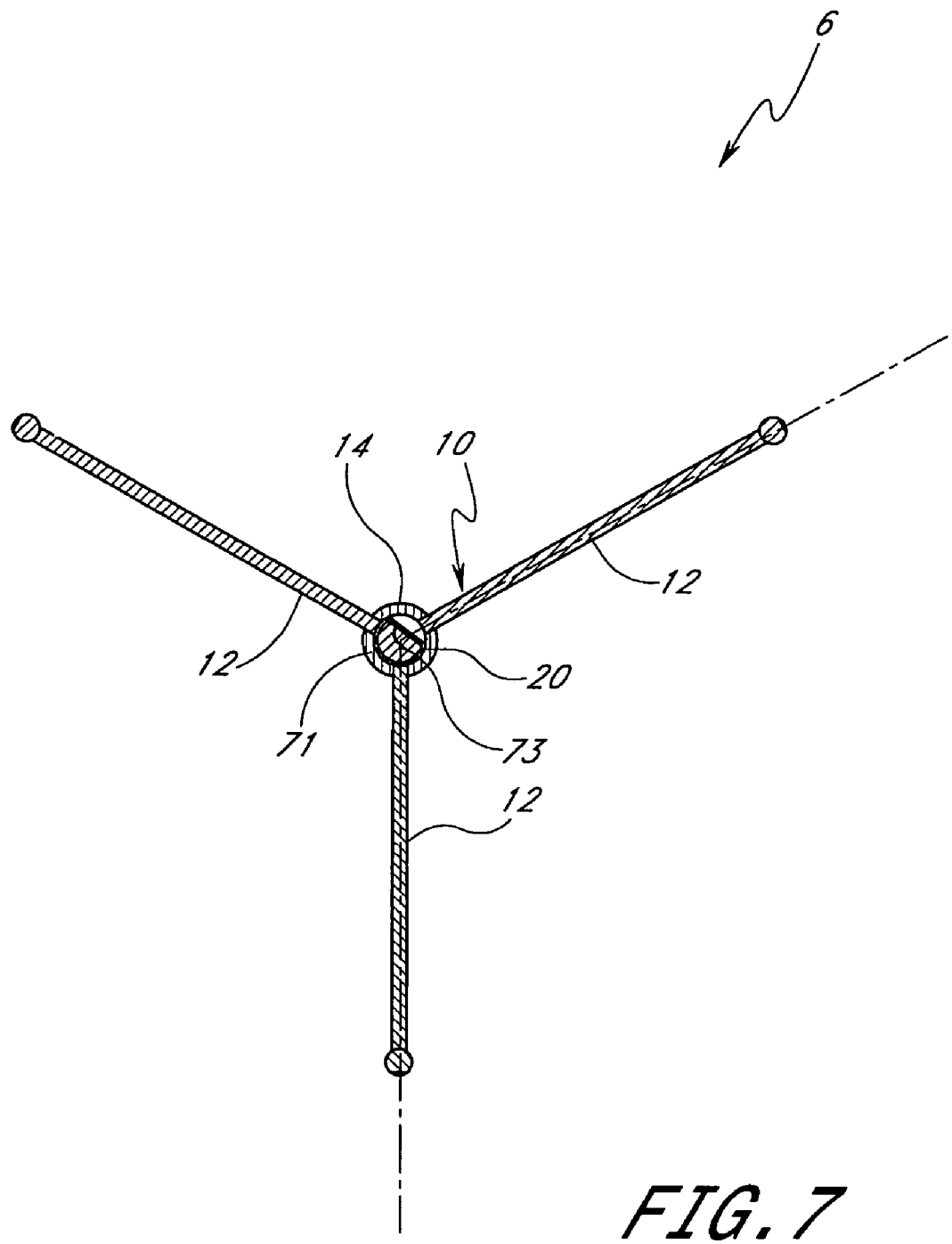
FIG. 7 is a top cross-sectional view of an alternate embodiment employing a shaped socket in conjunction with a correspondingly shaped shaft.

In yet another alternate embodiment, the shaft (or rotational drive) and the interior of the substrate holder support socket (or rotational drive interface) are shaped to precisely fit together (e.g., to prevent rotational slippage). For example, as shown in FIG. 7, the shaft 20 is machined to have a non-rounded (e.g., flat) section 73 which precisely mates with a correspondingly machined spider socket having a shaped section 71 in order to prevent rotational slippage. In other alternate embodiments, the shaft and socket are configured to have corresponding shapes other than those shown in FIG. 7 (e.g., notched shaft and corresponding socket extension).

Figure 8:
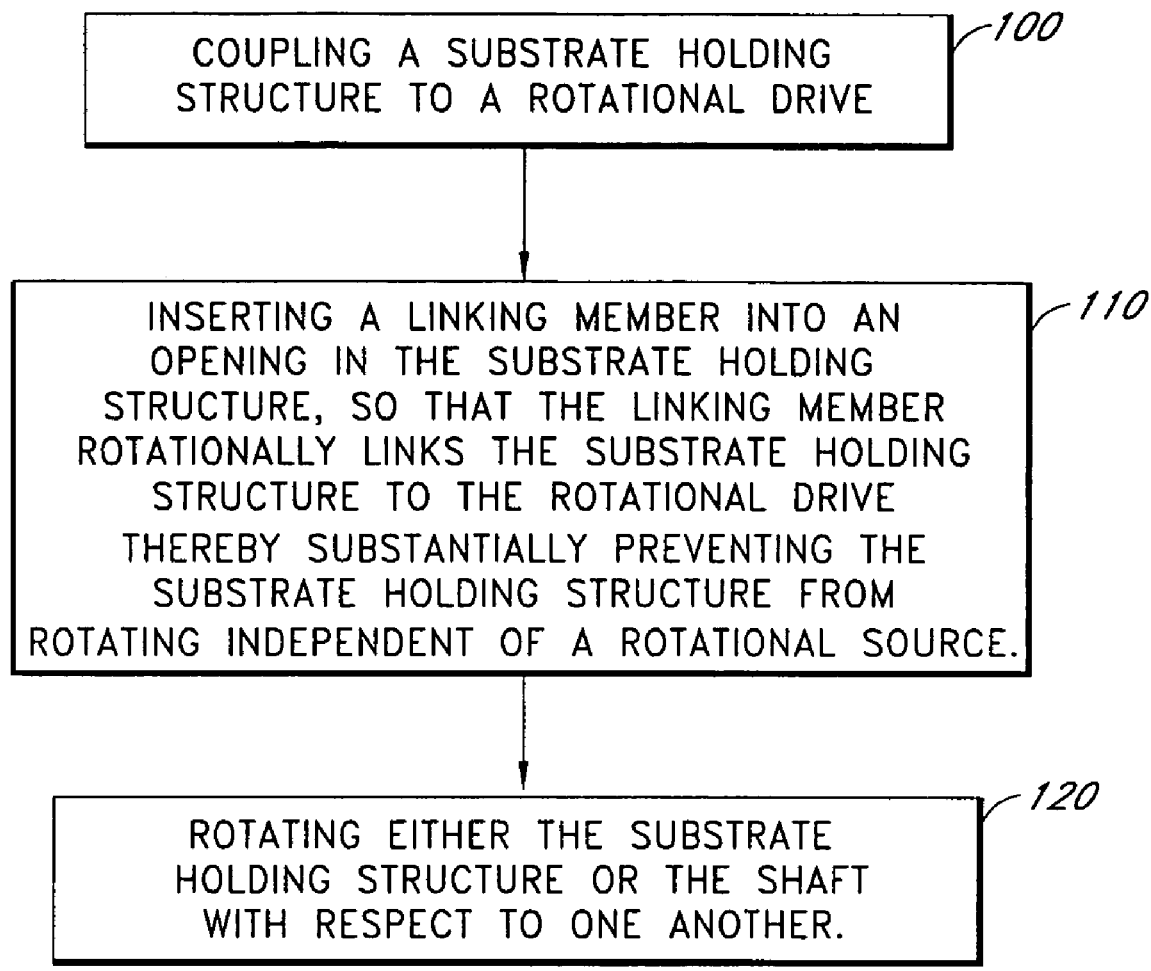
FIG. 8 is a flow chart illustrating a method of assembling a rotating susceptor assembly, in accordance with a preferred embodiment of the present invention.

FIG. 8 illustrates a method of rotating a rotating susceptor holding assembly by coupling 100 a substrate holding structure (e.g., spider) to a rotational drive (e.g., shaft). A linking member is inserted 110 into an opening in the substrate holding structure, so that the linking member rotationally links the substrate holding structure to the rotational drive, thereby preventing the substrate holding structure from rotating independent of a rotational source. Either the substrate holding structure or the rotational drive are rotated 120 with respect to one another.

Figure 9:
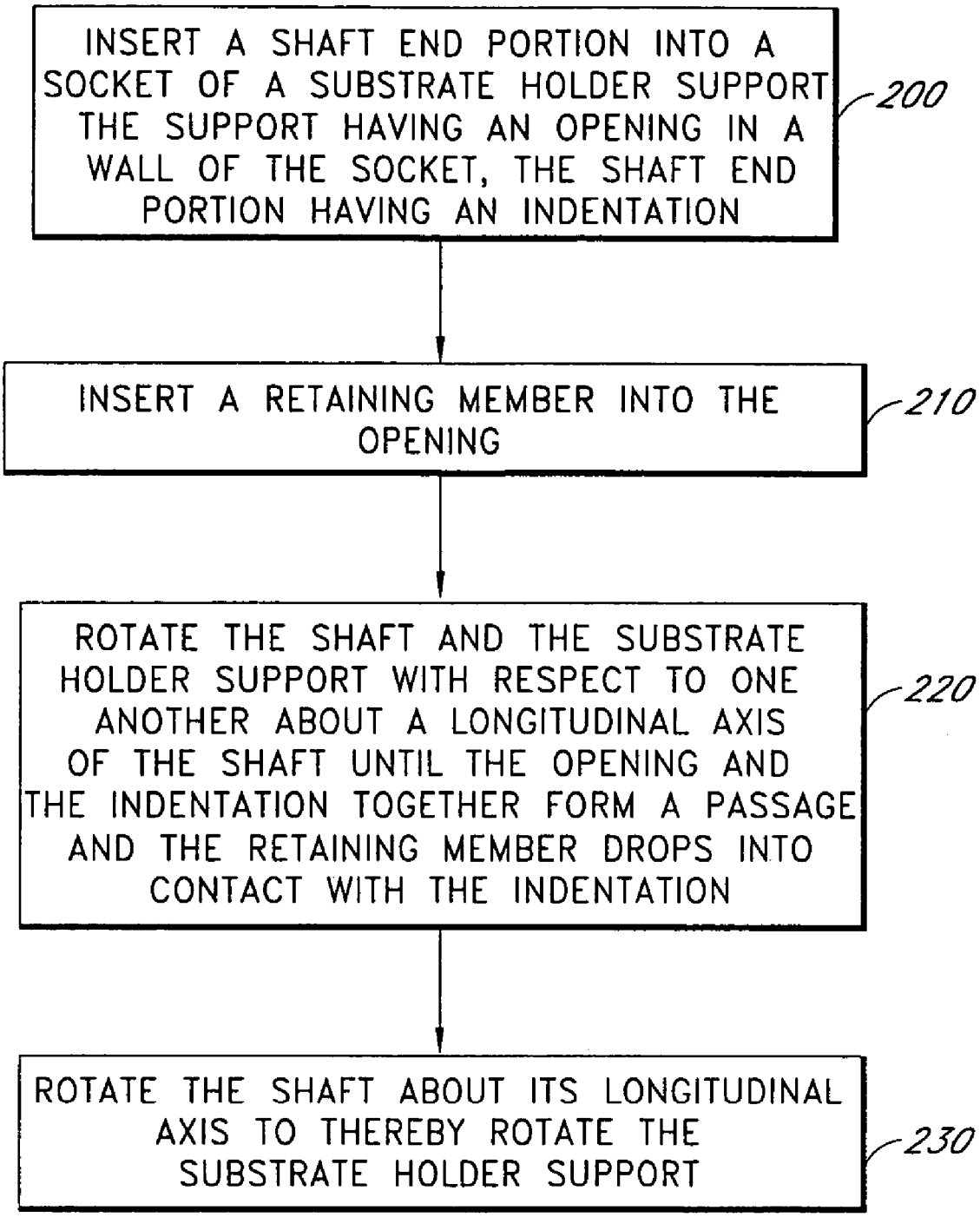
FIG. 9 is a flow chart illustrating a method of rotating a substrate holder support, in accordance with another preferred embodiment of the present invention.

In a preferred embodiment shown in FIG. 9, a shaft end portion is inserted 200 into a socket of a substrate holder support. The support has an opening in the wall of the socket and the shaft end portion has an indentation. A retaining member is inserted 210 into the opening. The shaft and the substrate holder are then rotated 220, preferably manually, with respect to one another about a longitudinal axis of the shaft until the opening and the indentation together form a passage and the retaining member drops into contact with the indentation (i.e., a first fully engaged position). The shaft is then rotated 230 about its longitudinal axis to thereby rotate the substrate holder support. Advantageously, the substrate holder support can then be freely lifted out of the first fully engaged position for replacement or other routine maintenance.

Preferred embodiments prevent the substrate support holder from rotating independent of the shaft. In other words, preferred embodiments prevent rotational slippage. However, the skilled artisan will appreciate that, even with the locking features of the embodiments described herein, some small amount of slippage can be caused by machining tolerances affecting the fit of the retaining member relative to the substrate support holder and/or the shaft. Accordingly, preventing rotational slippage and securing or locking the substrate support holder to the shaft, as used herein, is meant to encompass such small amounts of slippage caused by machining tolerances.

In another preferred embodiment the linking member is inserted after coupling the substrate holding structure to the rotational linkage. In this embodiment, inserting the linking member would comprise inserting an end portion of a shaft into a socket of a support for a wafer holder, the support having an opening in a wall of the socket, the shaft end portion having one or more linking member contact surfaces. The shaft and support are then rotated with respect to one another about a longitudinal axis of the shaft until the opening and one of the one or more contact surfaces together form a passage. The linking member is inserted into the passage so that the linking member prevents the wafer holder support from rotating with respect to the shaft. After the linking member is inserted into the passage, the shaft is rotated about its longitudinal axis to thereby rotate the wafer holder support.

In another preferred embodiment, a method of assembling a rotating susceptor assembly is provided. During assembly, the substrate holding structure is coupled to a rotational linkage so as to prevent rotational slippage of the susceptor holding structure relative to the rotational linkage during rotation of the substrate holding assembly. Preferably, the rotational linkage is linked or "clocked," with respect to rotational forces, to the substrate holding structure using a linking member which prevent rotational slippage by engaging a hole in the substrate holding structure and contacting a contact surface of the rotational linkage.

In yet another preferred embodiment, a rotational linkage and substrate holding structure, which are shaped to precisely fit together (e.g., the assembly shown in FIG. 7), are employed. A shaped portion of the substrate holding structure is aligned with a correspondingly shaped section of the rotational linkage and lowered onto the rotational linkage. As a result, the substrate holding structure is coupled to the rotational linkage so as to prevent rotational slippage of the susceptor holding structure relative to the rotational linkage during rotation of the substrate holding assembly.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications thereof. For example, the shaft could be configured to have an integral receptor which engages an integral substrate holder support extension. An opening would then preferably be located in the side of the receptor and the indention would be in the extension. Thus, it is intended that the scope of the present invention herein disclosed should not be limited by the particular disclosed embodiments described above, but should be determined only by a fair reading of the claims that follow.

We claim:

1. A support assembly for supporting a substrate holder during semiconductor substrate processing, comprising:
   a substrate holder support configured to support a substrate holder and to be supported by a rotational drive for rotating the substrate holder support;
   a rotational drive for rotating the substrate holder support;
   a retaining member configured to couple the substrate holder support to the rotational drive to thereby prevent rotational slippage of the substrate holder support relative to the rotational drive, the retaining member being selectively removable from the substrate holder support and the rotational drive; and
   a securing element that enables selective engagement/disengagement of the retaining member between the substrate holder support and the rotational drive.

2. The support assembly of claim 1, wherein the rotational drive comprises an elongated shaft having a longitudinal axis and an outer surface, the shaft having at least one indentation in the outer surface, the indentation being configured to be engaged by the retaining member.

3. The support assembly of claim 2, wherein the at least one indentation comprises three indentations, the retaining member being configured to engage with any one of the indentations.

4. The support assembly of claim 3, wherein the three indentations are spaced apart equally about a perimeter of the shaft.

5. The support assembly of claim 2, wherein one end of the shaft includes a tapered surface and the at least one indentation is located on the tapered surface.

6. The support assembly of claim 2, wherein the at least one indentation consists of only one indentation.

7. The support assembly of claim 2, wherein the retaining member and the at least one indentation of the shaft are configured so that the retaining member does not prevent the substrate holder support from being lifted vertically with respect to the shaft when the retaining member is inserted into both the opening and the at least one indentation.

8. The support assembly of claim 1, wherein the retaining member comprises a ceramic material.

9. The support assembly of claim 8, wherein the retaining member comprises quartz.

10. The support assembly of claim 1, wherein the rotational drive comprises a shaft having at least one indentation, and the substrate holder support comprising a socket configured to receive a portion of the shaft, the support having an opening located in a sidewall of the socket, the support being configured so that insertion of the retaining member into the opening engages the retaining member with the at least one indentation in the shaft to prevent rotation of the substrate holder support with respect to the shaft.

11. The support assembly of claim 10, wherein the opening and the at least one indentation, when aligned, together form a passage configured to receive the retaining member.

12. The support assembly of claim 10, wherein the opening comprises an elongated slot, the retaining member being sized and configured to be received within and occlude substantially the entire length of the slot.

13. The support assembly of claim 12, wherein the securing element enables selectively securing the retaining member in the slot.

14. The support assembly of claim 10, wherein the retaining member has a first end and a second end oriented generally transverse to the first end, the first end configured to be inserted into the opening in engagement with the shaft indentation, the first end being rotatable within the opening such that the second end is movable between a first position and a second position, wherein when the second end is in the second position the first end is prevented from being pulled out of the opening and the indentation by a securing element of the substrate holder support bearing against the second end, and wherein when the second end is in the first position the first end can be freely pulled out of the opening and the indentation.

15. The support assembly of claim 10, wherein the opening is substantially cylindrical and the retaining member includes a substantially cylindrical end portion configured to be removably and slidably inserted into the opening.

16. The support assembly of claim 15, wherein the end portion of the retaining member is configured to substantially fill the opening.

17. The support assembly of claim 10, wherein the substrate holder support is configured to support a substrate holder for holding a semiconductor wafer.

18. The support assembly of claim 17, further comprising the substrate holder, wherein the substrate holder is configured to support a 300 mm wafer.

19. The support assembly of claim 10, further comprising the substrate holder, wherein the substrate holder comprises a susceptor.

20. The support assembly of claim 10, wherein the substrate holder support includes a plurality of arms extending generally radially outward and upward from the socket, the arms configured to support a substrate holder.

21. The support assembly of claim 1, wherein the retaining member secures the substrate holder support to the rotational drive to prevent rotational slippage while allowing the substrate holder support to be lifted free of the rotational drive.

22. A semiconductor substrate processing system, comprising:
   a support member having a receptor and a plurality of arms extending generally radially outward from the receptor, the arms being configured to support an underside of a substrate holder, the receptor having a an hole in a sidewall of the receptor;
   a locking key;
   an elongated rotational linkage having an end portion configured to be received within the receptor such that the rotational linkage is at least partially rotatable with respect to the receptor about a longitudinal axis of the rotational linkage, the end portion having at least one retaining surface, the at least one retaining surface and the hole configured so that when the rotational linkage is rotated to a locking position, the at least one retaining surface and the hole together form a passage sized and configured to receive the locking key in a manner such that the locking key prevents the support member from rotating independently of the rotational linkage;

a securing element that enables selective engagement/disengagement of the locking key between the support member and the rotational linkage.

23. The system of claim 22, wherein the locking key locks the support member to the rotational drive with respect to rotationally and horizontally applied forces without locking the support member to the rotational drive with respect to vertically applied forces.

* * * * *